United States Patent [19]

Stein

[11] Patent Number: 4,851,320
[45] Date of Patent: Jul. 25, 1989

[54] METHOD OF FORMING A PATTERN OF CONDUCTOR RUNS ON A DIELECTRIC SHEET

[75] Inventor: William W. Stein, Beaverton, Oreg.

[73] Assignee: Tektronix, Inc., Beaverton, Oreg.

[21] Appl. No.: 197,483

[22] Filed: May 23, 1988

[51] Int. Cl.$^4$ .............................................. G03C 11/00
[52] U.S. Cl. .................................... 430/198; 430/256; 430/291; 430/315; 430/330
[58] Field of Search ............... 430/198, 256, 291, 315, 430/330

[56] References Cited

U.S. PATENT DOCUMENTS

| 4,247,619 | 1/1981 | Cohen et al. | 430/291 |
| 4,504,529 | 3/1985 | Sorensen et al. | 430/16 |
| 4,604,340 | 8/1986 | Grossa | 430/291 |

Primary Examiner—Ellis P. Robinson
Assistant Examiner—P. J. Ryan
Attorney, Agent, or Firm—John D. Winkelman; John Smith-Hill

[57] ABSTRACT

A selected pattern of conductor runs is formed on a sheet having a surface layer of dielectric material, by forming an electrostatically charged image of the selected pattern on the surface layer. Toner powder, comprising core particles of conductive material coated with fusible dielectric material, is deposited on the surface layer and is fused to the sheet.

16 Claims, No Drawings

METHOD OF FORMING A PATTERN OF CONDUCTOR RUNS ON A DIELECTRIC SHEET

BACKGROUND OF THE INVENTION

This invention relates to a method of forming a pattern of conductor runs on a dielectric sheet.

A so-called hybrid integrated circuit comprises a sheet-form substrate of ceramic material having one or more electronic components, such as monolithic integrated circuit chips, adhered to an upper surface of the substrate. Each electronic component has at least two terminals. The substrate may be composed of multiple sheets of ceramic material, secured together by sintering. Conductor runs are formed on the upper surface of each sheet. The conductor runs on each sheet interconnect contact pads on that sheet. A contact pad on the upper sheet may be wire bonded to a terminal of an electronic component, connected to a contact pad of one of the lower sheets through a via in the upper sheet (and possibly one or more vias in the lower sheet(s)), or connected to a conductor run of a printed circuit board. A contact pad on a lower sheet may be connected to a contact pad of another sheet through one or more vias.

It is known to use a screen printing process for providing a desired pattern of conductor runs on a ceramic sheet. In this process, a conductive ink is printed onto the ceramic sheet when it is in the unfired, or green, state. The green ceramic sheet comprises alumina powder in a matrix of an organic binder material, such as the material sold by Monsanto Company under the trademark BUTVAR 60, and is flexible and quite tough. The ink comprises a suspension of tungsten powder in an organic vehicle, and the pattern is defined by conventional screen printing techniques. After printing, the green ceramic sheet is heated to a temperature of about 800° C. in air in order to burn off the organic binder material and the organic vehicle, which decompose into carbon dioxide and water, and is then fired at a temperature of about 1700° C. in an atmosphere of hydrogen. During the firing operation, the tungsten is sintered to the ceramic material.

This conventional process is not suitable for manufacture of a small number of sheets, such as might be required for prototyping a hybrid circuit. In particular, it is not economical to manufacture a printing screen if only a few sheets are to be printed.

In a laser printer, a photoconductive drum is electrostatically charged and is then exposed using a scanning laser beam. The area that is exposed is the negative of a desired image. Accordingly, the charged area of the drum corresponds to the image. Charged toner powder is applied to the drum, and adheres to the drum only at those regions that have not been exposed by the laser beam. The toner particles are transferred to a sheet of paper and are fused thereto.

It is also known to print an image on paper having a surface coating of dielectric material by placing the paper on a grounded platen and electrostatically charging the surface coating in selected regions by use of a conductive stylus that is connected to a potential source. Toner powder is deposited on the coated paper and adheres to the paper only in the regions that have been charged. The toner powder is then fused.

Another method of forming an image on a sheet of paper involves placing the paper between a film of photoconductive material and a conductive platen. A bias is established between the film of photoconductive material and the platen, and therefore the paper is charged. The photoconductive material is exposed with the negative of the desired image, and accordingly the paper is partially discharged, resulting in a charge image that corresponds to the desired image. Toner powder is applied to the paper and adheres only to the charged regions. The toner powder that adheres to the paper is fused to the paper.

One kind of toner powder that is conventionally used in laser printers, comprises core particles of magnetic material, e.g. iron or iron oxide, coated with a fusible wax that contains a pigment. The magnetic nature of the core particles enables the powder to be brought into contact with the photoconductive drum of the laser printer using a magnetic brush. The toner particles, which have previously been electrostatically charged, are transferred electrostatically from the magnetic brush to the charged areas of the drum.

In other types of xerographic imaging devices that employ photoconductive drums, the toner powder is poured onto the drum from above, or is agitated by bubbling air through a bed of toner material and the drum is positioned so that its periphery passes through the bed of agitated toner material. Thus, it is not essential to use a magnetic brush in order to tone a charged surface.

SUMMARY OF THE INVENTION

A preferred embodiment of the present invention in a first aspect is a method of forming a selected pattern of conductor runs on a sheet. The method comprises providing a sheet having a surface layer of dielectric material, and forming an electrostatically charged image of the selected pattern on the surface layer of the sheet. Toner powder, comprising core particles of conductive material coated with fusible dielectric material, is deposited on the surface layer and is fused to the sheet.

A preferred embodiment of the present invention in its second aspect is a method of forming a selected pattern of conductor runs on a green ceramic sheet, comprising providing a pattern transfer member having a surface layer of dielectric material, and forming an electrostatically charged image of the selected pattern on the surface layer of the pattern transfer member. The surface layer of the member is discharged in accordance with the negative of the selected pattern. Toner powder, comprising core particles of conductive material coated with fusible dielectric material, is deposited on the surface layer of the pattern transfer member. The toner powder that adheres to the pattern transfer member is subsequently transferred from the pattern transfer member to the sheet.

A preferred embodiment of the present invention in its third aspect is a method of forming a pattern of conductor runs on a dielectric sheet. The method comprises forming an electrostatically charged image of the selected pattern on a surface of the sheet, and applying toner powder, comprising particles of conductive material coated with fusible dielectric material, to said surface of the sheet. The toner powder is fused to the sheet.

A preferred embodiment of the present invention in its fourth aspect is a toner powder for use in forming a pattern on a sheet of a selected ceramic material, comprising core particles of a conductive material coated with fusible dielectric material. The conductive material is such that it sinters to the selected ceramic material at a firing temperature of the ceramic material and remains in a reduced state at the firing temperature.

DETAILED DESCRIPTION

The method of manufacturing toner powder having core particles of iron or iron oxide can be applied to manufacture of a toner powder having core particles of tungsten.

A computer-aided design system is used to generate a signal representing the negative of the pattern of conductor runs desired on a layer of a multilayer ceramic hybrid circuit, and this signal is used to modulate the scanning laser beam of a laser printer, and thereby control exposure of the photoconductive drum of the laser printer. The drum is toned using the toner powder having tungsten core particles, and the toner powder adheres to the surface of the drum in accordance with the desired pattern of conductor runs. The receiver sheet that is passed through the printer is a green ceramic sheet comprising alumina in a matrix of the organic binder sold under the trademark BUTVAR 60. The toner powder is transferred from the drum to the green ceramic sheet, and is fused to the sheet in conventional fashion. The green ceramic sheet is fired in a two stage process. In the first stage, which takes place in air, the organic binder material and the wax material of the toner are decomposed and disperse as carbon dioxide and water. In the second stage, which takes place in an atmosphere of hydrogen at a temperature of 1700° C., the tungsten core particles are sintered to the ceramic sheet.

In a second embodiment of the invention, a green ceramic sheet having a conductivity of about $10^7$ ohms per square is provided with a surface coating of organic photoconductive material. A green ceramic sheet comprising alumina in a matrix of BUTVAR 60 binder material can be afforded suitable conductivity by adding a small amount of an organic conductive material to the binder material. Organic photoconductive materials are referred to in Neblette's Handbook of Photography and Reprography, Seventh Edition (1977), published by Van Nostrand, Reinhold Company, page 334. The photoconductive coating is then charged by placing the green ceramic sheet on a conductive platen at a positive potential with the photoconductive coating uppermost. A negative charge is induced on the upper surface of the photoconductive coating. The coating is then discharged in accordance with the negative of the desired pattern of conductor runs. The exposure may be effected by a scanning laser beam, modulated in similar manner to that described above, or by use of an unmodulated light source and a mask. In either case, the resulting charge image corresponds to the desired pattern of runs. The upper surface of the green ceramic sheet is toned using positively charged toner powder having tungsten core particles. The toner powder adheres to the green ceramic sheet in the regions that are still negatively charged, and not elsewhere. The toner is then fused. The green ceramic sheet is fired by the two-stage process described above, and during this process the photoconductive coating, the organic binder material (and the conductive material added thereto) and the wax of the toner powder decompose, and the tungsten core particles are sintered to the ceramic sheet.

In a third embodiment of the invention, the green ceramic sheet is placed on a grounded platen, and a charge image is formed on the upper surface of the sheet using a conductive stylus that is connected to a negative potential source. The green ceramic sheet is toned using positively charged tone powder having tungsten core particles, and the toner is fused to the ceramic sheet. As in the case of the first and second embodiments, the ceramic sheet is fired, and during the firing process the wax of the toner powder decomposes and the tungsten core particles are sintered to the ceramic sheet.

It will be appreciated that the present invention is not restricted to the particular embodiments that have been described, and that variations may be made therein without departing from the scope of the invention as defined in the appended claims and equivalents thereof. For example, the invention is not limited to use of tungsten as the material of the core particles of the toner powder. If a metal is used for the material of the core particles, it must have a melting point that is higher than the temperature at which the ceramic is fired, and must not be oxidized during the firing operation. If a low temperature firing ceramic is used, metals such as gold, silver and copper may be used instead of tungsten.

I claim:

1. A method of forming a selected pattern of conductor runs on a dielectric sheet, comprising:
    (a) forming an electrostatically charged image of the selected pattern on a surface of the sheet,
    (b) applying a toner powder to said surface, the toner powder comprising core particles of conductive material coated with fusible dielectric material, and
    (c) fusing the toner powder.

2. A method according to claim 1, wherein step (a) comprises electrostatically charging said surface and discharging said surface in accordance with the negative of the selected pattern.

3. A method according to claim 1, wherein the sheet is a green ceramic sheet, and the method further comprises firing the sheet.

4. A method according to claim 1, wherein the core particles are metal.

5. A method according to claim 4, wherein the sheet is a green ceramic sheet, the method comprises firing the green ceramic sheet, and the firing takes place in a first stage, in which the ceramic sheet is heated in an oxidizing atmosphere to a first predetermined temperature, at which said dielectric material decomposes, and a second stage, in which the ceramic sheet is heated in a reducing atmosphere to a second predetermined temperature, which is higher than the first temperature and at which the core particles are sintered to the ceramic sheet.

6. A method of forming a selected pattern of conductor runs on a green ceramic sheet, comprising:
    (a) providing a pattern transfer member having a surface layer of dielectric material,
    (b) forming an electrostatically charged image of the selected pattern on the surface layer of the pattern transfer member,
    (c) applying a toner powder to said surface layer, the toner powder comprising core particles of conductive material coated with dielectric material, and
    (d) transferring the toner powder from the pattern transfer member to the green ceramic sheet.

7. A method according to claim 6, wherein step (b) comprises electrostatically charging the surface layer of the sheet and discharging said surface layer in accordance with the negative of the selected pattern.

8. A method according to claim 7, wherein the dielectric material is a photoconductive material and the surface layer is discharged by exposing the surface layer to a light source.

9. A method according to claim 6, wherein the core particles are metal.

10. A method according to claim 9, wherein the method further comprises firing the green ceramic sheet and the firing takes place in a first stage, in which the ceramic sheet is heated in an oxidizing atmosphere to a first predetermined temperature, at which said dielectric material decomposes, and a second stage, in which the ceramic sheet is heated in a reducing atmosphere to a second predetermined temperature, which is higher than the first temperature and at which the core particles are sintered to the ceramic sheet.

11. A method of forming a selected pattern of conductor runs on a sheet, comprising:
(a) providing a sheet having a surface layer of dielectric material,
(b) forming an electrostatically charged image of the selected pattern on the surface layer of the sheet,
(c) applying a toner powder to said surface, the toner powder comprising core particles of conductive material coated with fusible dielectric material, and
(d) fusing the toner powder.

12. A method according to claim 11, wherein step (b) comprises electrostatically charging the surface layer of the sheet with a first polarity and discharging said surface layer in accordance with the negative of the selected pattern, and the toner powder that is applied in step (c) is electrostatically charged with the polarity opposite the first polarity.

13. A method according to claim 12, wherein the dielectric material is a photoconductive material and the surface layer is discharged by exposing the surface layer to a light source.

14. A method according to claim 11, wherein the sheet is a green ceramic sheet, and the method further comprises firing the ceramic sheet.

15. A method according to claim 11, wherein the core particles are metal.

16. A method according to claim 15, wherein the sheet is a green ceramic sheet, the method further comprises firing the green ceramic sheet, and the firing takes place in a first stage in which the ceramic sheet is heated in an oxidizing atmosphere to a first predetermined temperature, at which said dielectric material decomposes, and a second stage, in which the ceramic sheet is heated in a reducing atmosphere to a second predetermined temperature, which is higher than the first temperature and at which the core particles are sintered to the ceramic sheet.

* * * * *